United States Patent
BrightSky et al.

(10) Patent No.: US 9,263,336 B2
(45) Date of Patent: Feb. 16, 2016

(54) SYMMETRICAL BIPOLAR JUNCTION TRANSISTOR ARRAY

(71) Applicant: International Business Machines Corporation, Armonk, NY (US)

(72) Inventors: Matthew J. BrightSky, Pound Ridge, NY (US); Jin Cai, Cortlandt Manor, NY (US); SangBum Kim, Yorktown Heights, NY (US); Chung H. Lam, Peekskill, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/288,600

(22) Filed: May 28, 2014

(65) Prior Publication Data
US 2015/0348844 A1   Dec. 3, 2015

(51) Int. Cl.
H01L 21/331  (2006.01)
H01L 21/8222 (2006.01)
H01L 27/24   (2006.01)
H01L 27/22   (2006.01)

(52) U.S. Cl.
CPC .......... *H01L 21/8222* (2013.01); *H01L 27/226* (2013.01); *H01L 27/2445* (2013.01)

(58) Field of Classification Search
CPC ................... H01L 2924/1305; H01L 29/1004; H01L 29/66234; H01L 21/8249; H01L 27/0623; H01L 27/0823; H01L 29/7325; H01L 27/0664; H01L 27/088; H01L 27/1022; H01L 29/42304; H01L 29/66265; H01L 27/082
See application file for complete search history.

(56) References Cited

U.S. PATENT DOCUMENTS

| 7,002,841 | B2 | 2/2006  | Yoo et al. |
| 7,759,764 | B2 | 7/2010  | Lee et al. |
| 7,811,879 | B2 | 10/2010 | Lam et al. |
| 8,130,537 | B2 | 3/2012  | Weis |
| 8,138,574 | B2 | 3/2012  | Chen et al. |

(Continued)

FOREIGN PATENT DOCUMENTS

EP  1418620 A2  5/2004

OTHER PUBLICATIONS

Bedeschi et al., "An 8Mb Demonstrator for High-Density 1.8V Phase-Change Memories", Symposium on VLSI Circuits Digest of Technical Papers, 2004, pp. 442-445, © 2004 IEEE. DOI: 10.1109/VLSIC.2004.1346644.

(Continued)

*Primary Examiner* — Stanetta Isaac
(74) *Attorney, Agent, or Firm* — Nicholas D. Bowman; Louis J. Percello

(57) ABSTRACT

A method of manufacturing a bipolar junction transistor (BJT) array may include forming a substrate of doped silicon and forming a plurality of BJTs on the substrate. Each of the BJTs may have a first region and a second region sandwiching a base region vertically. The first region may be in contact with the substrate, where the BJTs are formed in a first row and a second row. The first row and the second row may each have BJTs separated from one another by a word line distance and the first row and second row may be separated by a bit line distance. A plurality of word line contacts may be formed laterally enclosing and electrically connected to each base region of the BJTs. The word line contacts may have a lateral thickness more than one half the word line distance and less than one half the bit line distance.

20 Claims, 13 Drawing Sheets

(56) References Cited

U.S. PATENT DOCUMENTS

| | | | |
|---|---|---|---|
| 8,217,380 | B2 | 7/2012 | Rajendran et al. |
| 8,228,715 | B2 | 7/2012 | Andre et al. |
| 8,310,864 | B2 | 11/2012 | Lung et al. |
| 2011/0305074 | A1* | 12/2011 | Lung et al. .................... 365/163 |

OTHER PUBLICATIONS

Cai et al., "Complementary Thin-Base Symmetric Lateral Bipolar Transistors on SOI", IEEE International Electron Devices Meeting (IEDM), 2011, pp. 16.3.1-16.3.4, © 2011 IEEE DOI: 10.1109/IEDM.2011.6131565.

Chang et al., "Area-Efficient Embedded RRAM Macros with Sub-5ns Random-Read-Access-Time Using Logic-Process Parasitic-BJT-Switch (0T1R) Cell and Read-Disturb-Free Temperature-Aware Current-Mode Read Scheme", Symposium on VLSI Circuits (VLSIC), 2013, pp. C112-C113.

Krounbi et al., "Status and Challenges for Non-Volatile Spin-Transfer Torque RAM (STT-RAM)", International Symposium on Advance Gate Stack Technology, 2010, pp. 1-28, © 2010 Grandis Corporation http://www.sematech.org/meetings/archives/fep/9064/Pres/26%20M%20Krounbi.pdf.

Ning et al., "On the Performance and Scaling of Symmetric Lateral Bipolar Transistors on SOI", IEEE Journal of the Electron Devices Society, Jan. 2013, pp. 21-27, vol. 1, Issue 1 DOI: 10.1109/JEDS.2012.2233272.

Unknown, "Pulse I-V Characterization of Non-Volatile Memory Technologies", Keithley Application Note Series, Jan. 2013, pp. 1-26, No. 3141, © Copyright 2013 Keithley Instruments, Inc. www.keithley.com/data?asset=56338.

* cited by examiner

SYMMETRICAL BIPOLAR JUNCTION TRANSISTOR ARRAY

BACKGROUND

The present disclosure relates to resistive memory, and more specifically, to vertical bipolar junction transistors for accessing an array of resistive memory elements.

Resistive memory material may be used in resistive memory elements. Resistive memory material changes phase when electrical current is applied at levels suitable for implementation in integrated circuits. Different phases of resistive memory material may be characterized by different resistive properties, which may be used to indicate data, i.e., a logical "1" or "0."

SUMMARY

According to embodiments of the present disclosure, a method of manufacturing a bipolar junction transistor (BJT) array may include forming a substrate of doped silicon and forming a plurality of BJTs on the substrate. Each of the plurality of BJTs may have a first region of doped silicon and a second region of doped silicon sandwiching a base region vertically, relative to the substrate. The first region may be in contact with the substrate, where the BJTs are formed in a first row and a second row. The first row and the second row may each have BJTs separated from one another by a word line distance and the first row and second row may be separated by a bit line distance.

The method may include forming a first region insulator on the substrate, the first region insulator laterally enclosing each first region and partially enclosing each base region of the plurality of BJTs. The method may include etching a sidewall of each second region down to the base region to form a ledge laterally surrounding each second region. The method may include forming a second region insulator on each ledge of the plurality of BJTs, the second region insulator laterally enclosing the second region. The method may also include forming a plurality of word line contacts directly on the first region insulator, the word line contacts laterally enclosing and electrically connected to each base region of the plurality of BJTs, the plurality of word line contacts electrically insulated from the second region by the second region insulator, wherein the plurality of word line contacts have a lateral thickness more than one half the word line distance and less than one half the bit line distance.

The method may further include connecting each of the second regions to a resistive memory element. The resistive memory element may be selected from a group consisting of resistive random access memory, ferroelectric random access memory, spin-transfer torque memory, phase change random access memory, and magneto-resistive random access memory. The forming of the substrate and of the plurality of BJTs may include providing a first doped silicon layer, forming a second doped silicon layer directly on the first doped silicon layer, forming a third doped silicon layer directly on the second doped silicon layer, forming an insulator layer directly on the third doped silicon layer, and etching first trenches and second trenches orthogonal to the first trenches. The first and second trenches may extend through the insulator layer, the third doped silicon layer, and the second doped silicon layer, and partially through the first doped silicon layer.

The substrate may be defined by a portion of the first doped silicon layer below the first and second trenches. The first region may be a portion of the first doped silicon layer above the substrate, defined by the first and second trenches, the first region adapted to act as one of a collector or an emitter. The base region may be a portion of the second doped silicon layer on the first region, defined by the first and second trenches. The second region may be a portion of the third doped silicon layer on the base region, defined by the first and second trenches, the second region adapted to act as one of a collector or an emitter.

Forming a plurality of word line contacts may include growing an epitaxial layer of doped silicon laterally and vertically from the base region. Forming a plurality of word line contacts may include depositing a polysilicon layer directly on the first region insulator, planarizing a surface of the polysilicon layer, and etching the polysilicon layer so that the polysilicon layer at least laterally encloses the base region.

The plurality of word line contacts in the first row may form a first word line along the first row and the plurality of word line contacts in the second row may form a second word line along the second row. Each of the plurality of BJTs may be of a feature size, and the word line distance may be approximately equal to the feature size and wherein the bit line distance is approximately equal to two times the feature size.

The base region may have a first base junction between the first region and the base region, and a second base junction between the second region and the base region, and wherein the first base junction and the second base junction have an area which is substantially the same. The first region may have a first dopant concentration, the second region may have a second dopant concentration, and the base region may have a base dopant concentration. The first dopant concentration and the second dopant concentration may be greater than the base dopant concentration. The first region may have a first dopant concentration, the second region may have a second dopant concentration, and the first dopant concentration and the second dopant concentration may be approximately the same. The first region may be a collector and the second region may be an emitter. In certain embodiments, the first region may be an emitter and the second region may be a collector.

An array of BJTs may include a substrate of doped silicon and a plurality of BJTs on the substrate. Each of the plurality of BJTs may have a first region of doped silicon and a second region of doped silicon sandwiching a base region vertically, relative to the substrate. The first region may be in contact with the substrate. The base region may have a first width greater than a second width of the second region such that the base region defines a ledge laterally surrounding each second region. The BJTs may be positioned in a first row and a second row, the first row and second row may each have BJTs separated from one another by a word line distance and the first row and second row may be separated by a bit line distance.

The array may include a first region insulator may be on the substrate, the first region insulator laterally enclosing each first region and partially enclosing each base region of the plurality of BJTs. The array may include a second region insulator on each ledge of the plurality of BJTs, the second region insulator laterally enclosing the second region. The array may include a plurality of word line contacts directly on the first region insulator, the word line contacts laterally enclosing and electrically connected to each base region of the plurality of BJTs, the plurality of word line contacts electrically insulated from the second region by the second region insulator. The plurality of word line contacts may have a lateral thickness more than one half the word line distance and less than one half the bit line distance.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
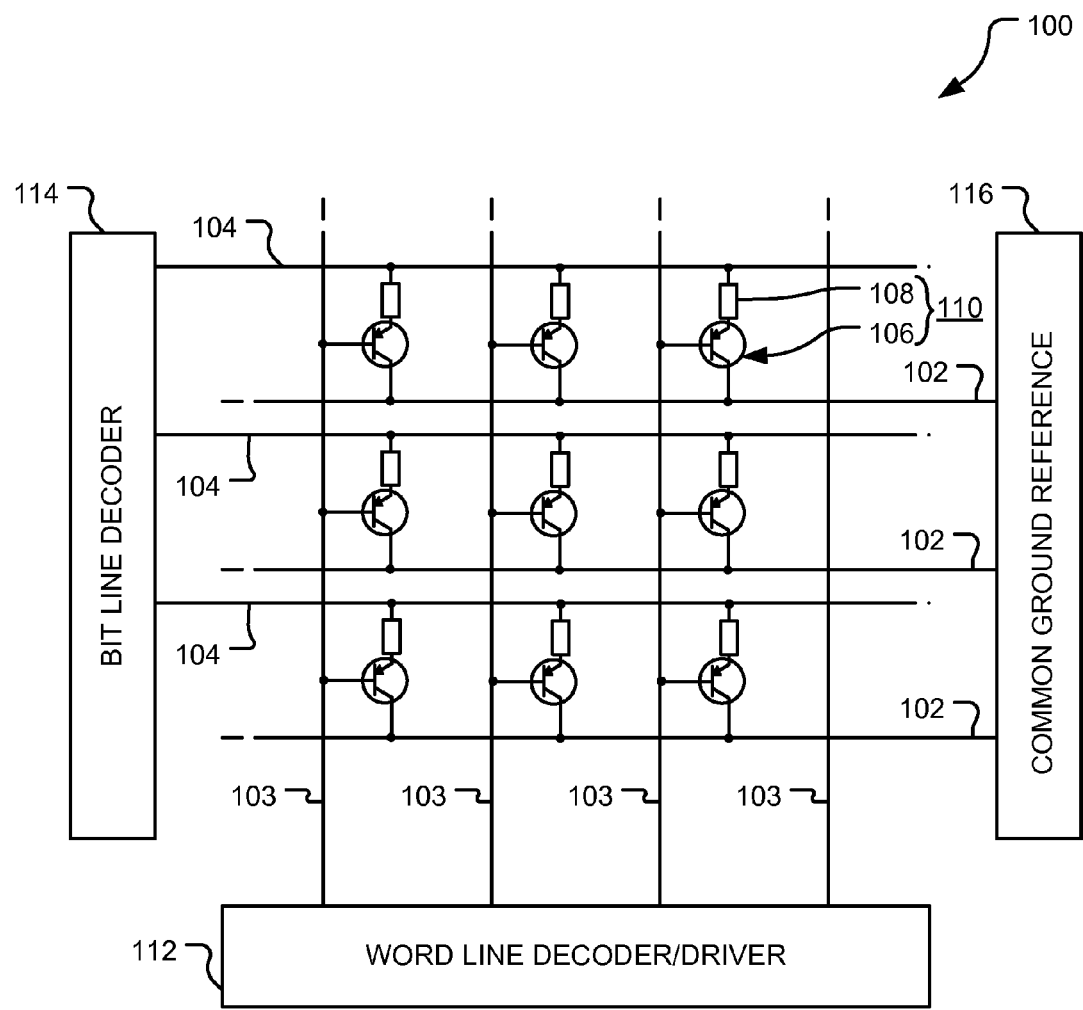
FIG. 1 depicts a schematic diagram of a portion of a memory cell array implemented using programmable resistance memory cells according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to bipolar junction transistor devices; more particular aspects relate to vertical bipolar junction transistor arrays connected to resistive memory elements. While the present disclosure is not necessarily limited to such applications, various aspects of the disclosure may be appreciated through a discussion of various examples using this context.

While the same nomenclature and same numbers may be used to identify elements throughout the disclosure, this practice is not intended to limit the scope of the disclosure. Identified elements in one figure may not be identical to other same named or identified elements in other figures.

Bipolar junction transistors (BJTs) may be used for access devices for resistive memory cells in a memory array. The greater the density of BJTs in an area, the higher the density of memory may be. Vertical BJTs, where the emitter, base, and collector are arranged in a stack and extend through a word line, may be used to increase the density of BJTs in an array. A memory cell and BJT array structure can be made as described herein implementing a self-aligned word line, which may reduce the layout area required for the BJT array and increase the density of memory cells connectable to the BJT array.

An array of BJTs may include a substrate of doped silicon, and a plurality of BJTs. Each of the plurality of BJTs may have a first region of doped silicon and a second region of doped silicon sandwiching a base region vertically, relative to the substrate. The first region may be in contact with the substrate, and the base region may have a first width greater than a second width of the second region, such that the base region defines a ledge laterally surrounding each second region. The BJTs may be positioned in a first row and a second row. The first row and second row each have BJTs separated from one another by a word line distance, and the first row and second row may be separated by a bit line distance. The array may include a first region insulator on the substrate, the first region insulator laterally enclosing each first region and partially enclosing each base region of the plurality of BJTs. The array may include a second region insulator on each ledge of the plurality of BJTs, the second region insulator laterally enclosing the respective second regions.

The array may also include a plurality of word line contacts directly on the first region insulator, the word line contacts laterally enclosing and electrically connected to each base region of the plurality of BJTs. The plurality of word line contacts may be electrically insulated from the second region by the second region insulator. The plurality of word line contacts may have a lateral thickness that is more than one half the word line distance and less than one half the bit line distance.

Referring now to FIG. 1, a schematic diagram of a portion of a bipolar junction transistor array 100 connected to programmable resistance memory cells may be seen according to embodiments of the present disclosure. The array 100 may include a plurality of bit lines 104 extending in parallel in a first direction and in electrical communication with bit line decoder 114. A plurality of word lines 103 extend in parallel in a second direction and are in electrical communication with word line decoder/driver 112. Each of the memory cells (e.g. memory cell 110) of the array 100 includes a bipolar junction transistor access device (e.g. BJT 106) and a memory element (e.g. element 108).

The manufacturing steps required for the combination of the access devices and the memory elements 108, along with the layout of the word lines 103 and bit lines 104 may include a number of independent alignment steps known in the art. Alignment steps may typically involve placement of masks or other steps that can be executed only within a predetermined alignment tolerance. The layout of the array 100 may be expanded to accommodate these alignment tolerances.

Memory cell 110 may be representative of memory cells of the array 100 and may include BJT 106 and a programmable resistance memory element 108. The programmable resistive memory element 108 may include a phase change material. The resistive memory element 108 and BJT 106 are arranged electrically in series between the common ground plane 102 and the corresponding bit line 104. The word line 103 may act as the base terminal of the BJT 106. In various embodiments, the BJT 106 may be a PNP device in which a first terminal (acting as a collector) may be coupled to the ground plane 102 and a second terminal (acting as an emitter) may be coupled via the resistive memory element 108 to the bit line 104. In certain embodiments, the BJT 106 may be an NPN device where the first terminal is the emitter and the second terminal is the collector. In embodiments, the BJT 106 may be symmetrical, where the BJT 106 may supply current in both polarities, independent of the orientation of the emitter and the collector. In embodiments, the memory cell 110 may be constructed as resistive random access memory, ferroelectric random access memory, spin-transfer torque memory, phase change random access memory, or magneto-resistive random access memory.

Reading or writing to a phase change memory cell 110 of the array 100 may be achieved by applying an appropriate voltage to the corresponding word line 103 and an appropriate voltage or current to the corresponding bit line 104 to induce a current through the memory element 108. The level and duration of the voltages/currents applied depends upon the operation performed, e.g. a reading operation or a writing operation.

Embodiments of the programmable resistance element 108 of the memory cell 110 may include phase-change-based memory materials, including chalcogenide based materials and other suitable phase change materials. Phase change materials may be doped with impurities in some embodiments to modify conductivity, transition temperature, melting temperature, and other properties of memory elements 110. Representative impurities used for doping may include nitrogen, silicon, oxygen, silicon dioxide, silicon nitride, copper, silver, gold, aluminum, aluminum oxide, tantalum, tantalum oxide, tantalum nitride, titanium and titanium oxide.

Figure 2:
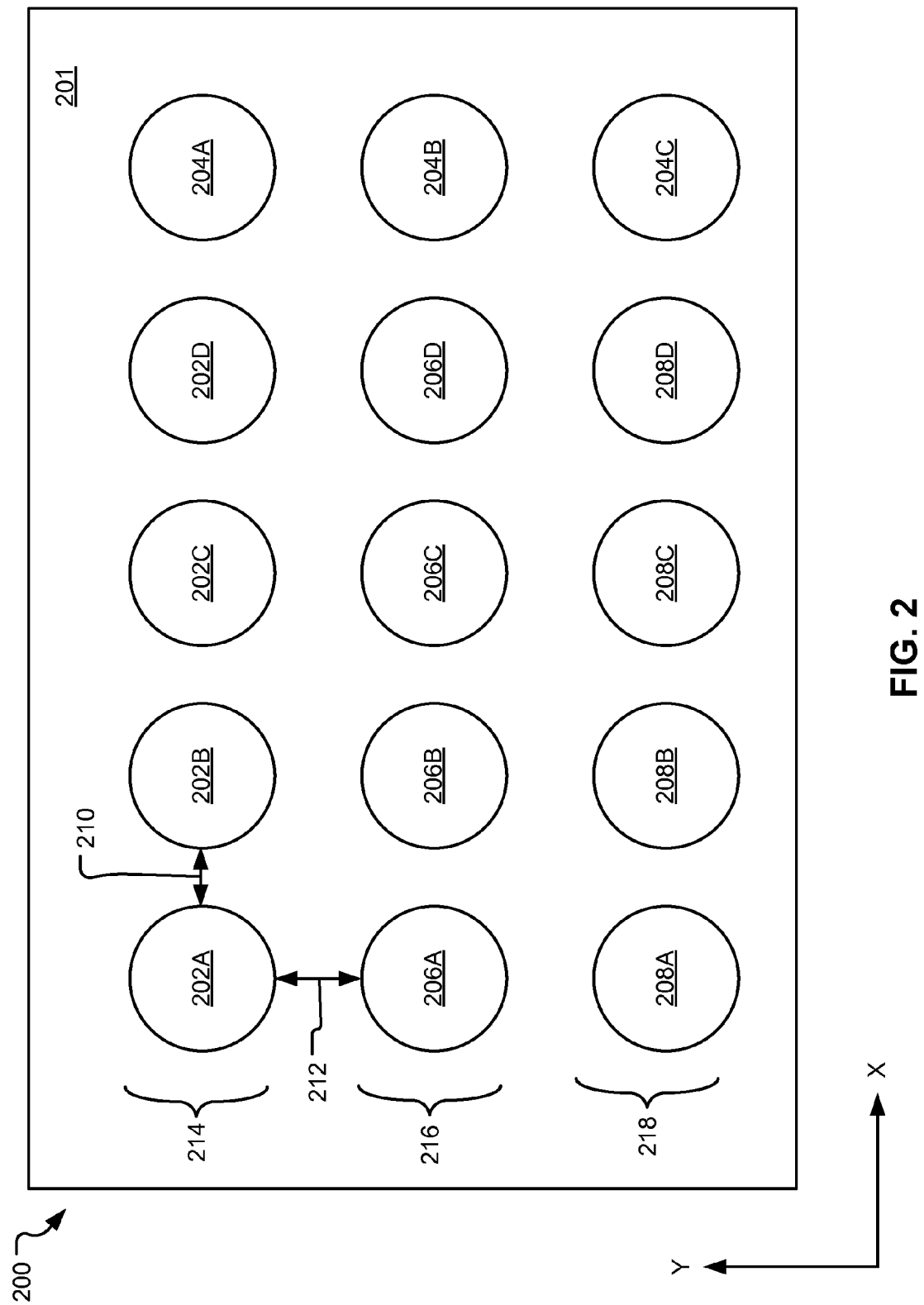
FIG. 2 depicts a cross sectional top view of a bipolar junction transistor array according to embodiments of the present disclosure.

Referring now to FIG. 2, a top view of an array of bipolar junction transistors 200 may be seen according to embodiments of the present disclosure. The array 200 may include a substrate 201 of conductive material and a plurality of vertical bipolar junction transistors (BJTs) 202A-202C, 206A-206C, 208A-208C positioned on the substrate 201. In addition, the rows 214, 216, 218 may also each include a word line pickup 202D, 206D, 208D, and a first region pickup 204A, 204B, 204C.

The substrate 201 may be constructed of conductive material adapted to be connected to a voltage reference, such as a common ground reference (FIG. 1, 116). The BJTs are formed in a plurality of rows along the X-direction, including a first row 214, a second row 216, and a third row 218 on the substrate 201. Each BJT may include a first region adapted to act as either a collector or an emitter, a base region, and a second region adapted to act as either a collector or an emitter. The first region pickup 204A, 204B, 204C may be electrically connected to the first region of each BJT in its corresponding row. For example, first region pickup 204A may be electrically connected to the first region of BJTs 202A-202C in row 214. In embodiments, the first region pickup 204A, 204B, 204C may be connected to the common ground reference (FIG. 1, 116) to act as a ground plane (FIG. 1, 102). These structures can be seen in more detail with reference to the cross-sections contained herein.

The plurality of BJTs in each of the rows may be separated from one another by a word line distance 210 measured in the X-direction between the nearest edges of adjacent BJTs in a row. In embodiments, each of the BJTs may be constructed to be of a feature size (F). In embodiments, the word line distance 210 may be selected to be approximately equal to F. Each row may be separated from one another in the Y-direction by a bit line distance 212 measured in the Y-direction between the nearest edges of BJTs in adjacent rows. In embodiments, the bit line distance 212 may be selected to be approximately equal to twice the feature size (2F). Note that FIG. 2 may not be drawn to scale.

Figure 3:
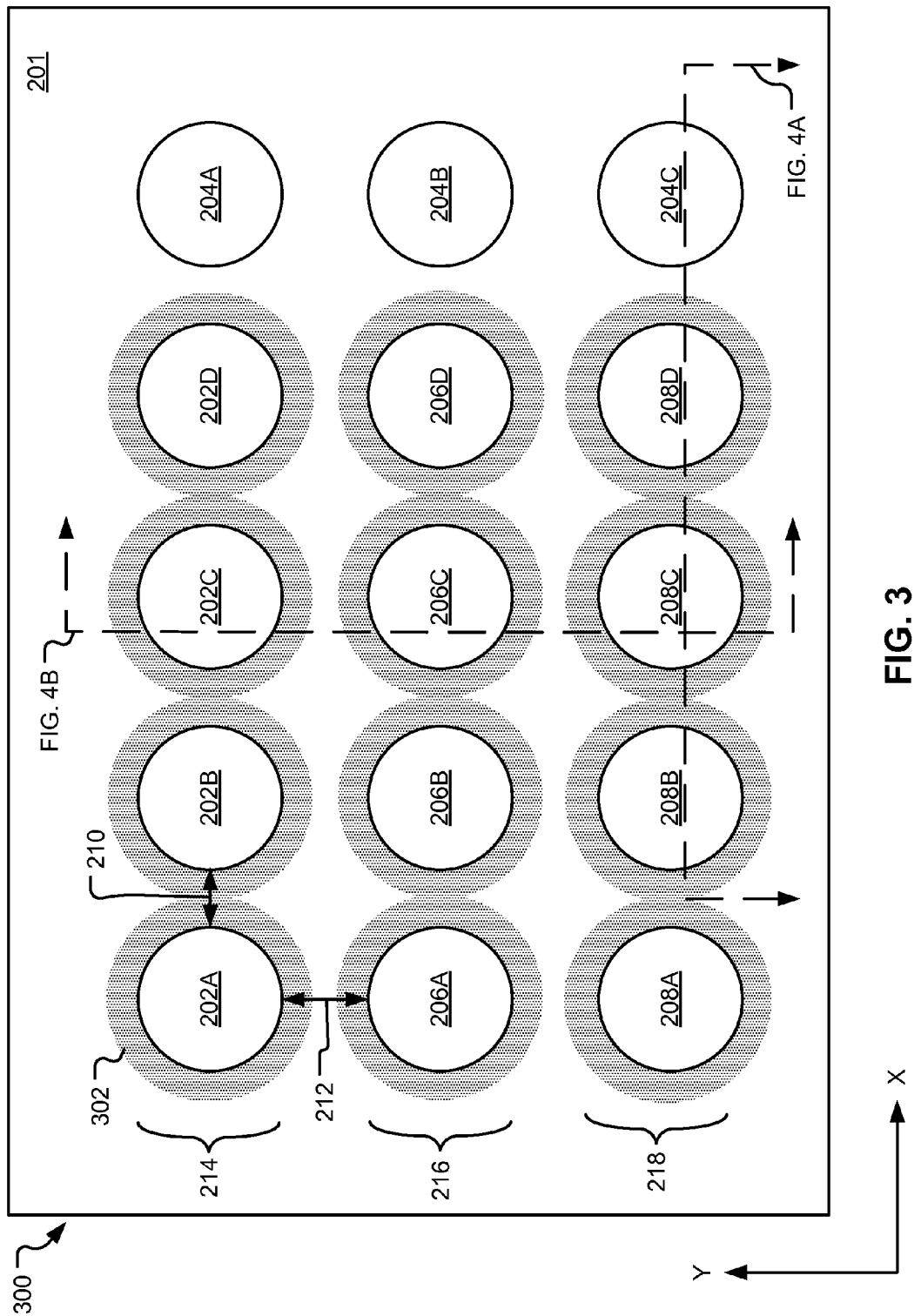
FIG. 3 depicts a cross sectional top view of a bipolar junction transistor array having a plurality of word line contacts according to embodiments of the present disclosure.

Referring now to FIG. 3, a top view of an array of bipolar junction transistors 300 may be seen according to embodiments of the present disclosure. The array 300 may include a substrate 201 of conductive material and a plurality of BJTs 202A-202C, 206A-206C, 208A-208C positioned on the substrate 201. The BJTs are formed in a plurality of rows on the substrate 201 including a first row 214, a second row 216, and a third row 218. Each row may be connected together by a word line contacts 302 surrounding each of the plurality of BJTs 202A-202C, 206A-206C, 208A-208C and each of word line pickup 202D, 206D, 208D.

For example, in FIG. 3, the plurality of word line contacts 302 in the first row 214 form a first word line connecting the base regions of each of the BJTs 202A-202C to the word line pickup 202D. The plurality of word line contacts 302 in the second row 216 form a second word line connecting the bases of the BJTs 206A-206C to the word line pickup 206D. The word line pickups 202D, 206D, 208D may be connected to the word line decoder/driver (FIG. 1, 112).

Figure 4A:
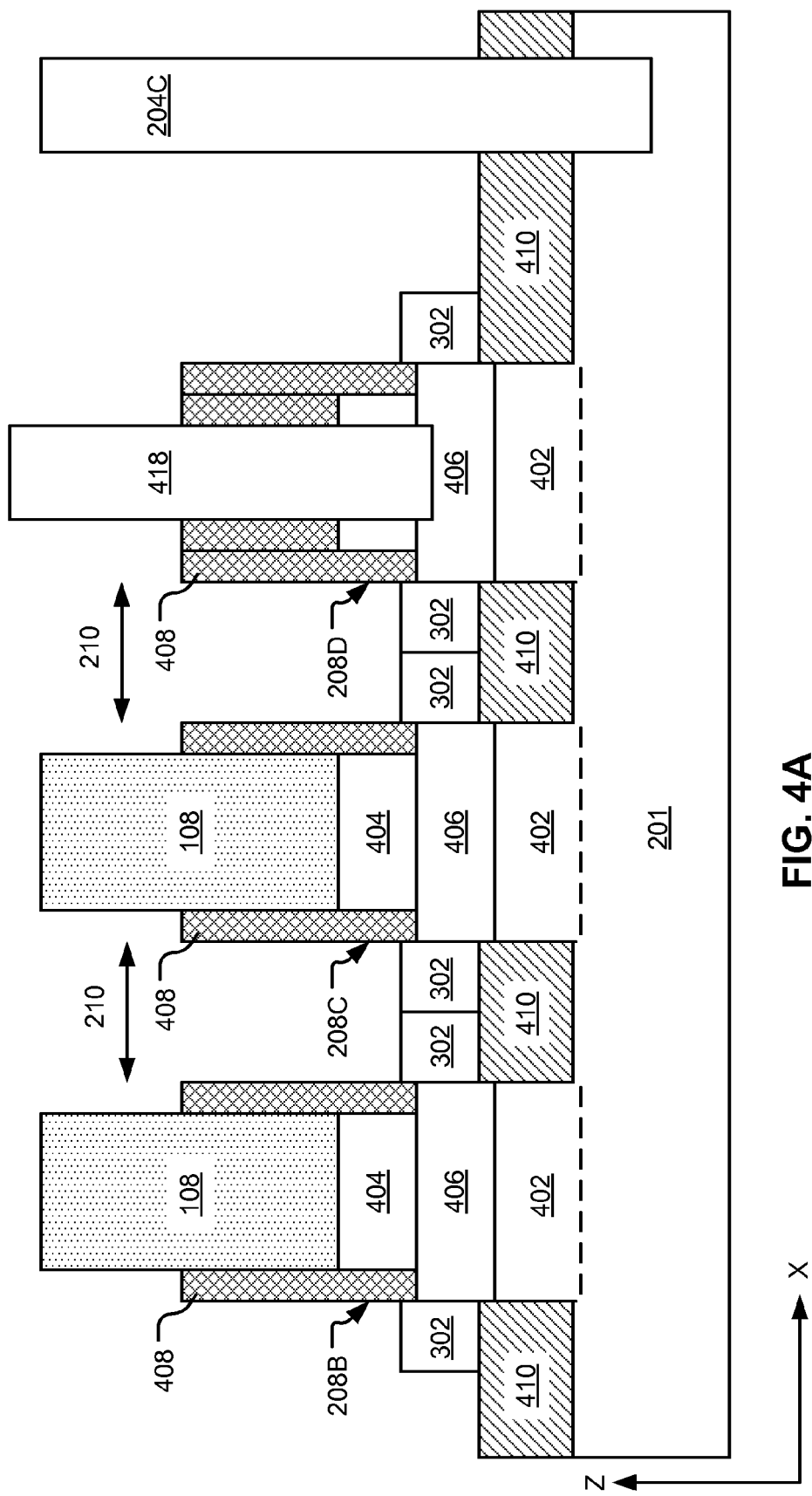
FIGS. 4A-4B depicts cross sectional side views of a portion of the bipolar junction transistor array of FIG. 3.

As described herein, the word line contacts 302 may laterally enclose and electrically connect to each base region of the plurality of BJTs. The plurality of word line contacts 302 may have a lateral thickness in both the X-direction and Y-direction of more than one half the word line distance 210 and less than one half the bit line distance 212. The BJTs may be arranged in the array 300 so that the spacing in the Y-direction is more than twice the thickness of the word line contacts 302 used to form the word lines (FIG. 1, 103). The spacing of the BJTs in the X-direction along the word lines may be less than twice the thickness of the word line contacts 302, so that the sidewalls merge in the X-direction to form word lines, but do not merge in the Y-direction. Thus, the word line contacts 302 for the BJTs in each row are electrically connected, and the word line contacts 302 between the rows themselves are not in contact and not electrically connected. Note that FIG. 3 may not be drawn to scale Referring now to FIG. 4A, a cross-section view in the Z-X plane of a portion of the structure of FIG. 3 may be seen according to embodiments of the present disclosure. The cross section view may include BJTs 208B, 208C, word line pickup 208D and first region pickup 204C. Each BJT may include a first region 402 and a second region 404 sandwiching a base region 406 vertically relative to a substrate 201. The first region 402 may be in contact with and electrically connected to the substrate 201. The BJTs 208B, 208C may have a first base junction between the first region 402 and the base region 406, and a second base junction between the second region 404 and the base region 406. In embodiments, the first base junction and the second base junction have an area which is substantially the same. In embodiments, the base junctions may be substantially same when they have an area which is within a factor of 2. In embodiments, the base junctions may be substantially the same when within they have an area within 30% of one another.

A first region insulator 410 may be formed on the substrate 201. The first region insulator 410 may be formed tall enough in the Z-direction so that it laterally encloses the first region 402 of each BJT 208B, 208C. The first region insulator 410 may also partially enclose the base region 406 of each BJT, so as to insulate the first region from word line contacts 302 formed on the first region insulator 410. The first region insulator 410 may be constructed from silicon oxide or any other suitable insulating material. A second region insulator 408 may be positioned on the top of the base region 406 and laterally enclose the second region 404 of the BJTs 208B, 208C. The second region insulator 408 may insulate the second region 404 from the word line contact 302 enclosing the base region 406 as described herein.

The first region 402, second region 404, and base region 406 may be constructed from suitable doped silicon materials. The BJTs may be constructed as N-type transistors or as P-type transistors. In embodiments, where the BJT is constructed as an N-type transistor, the base region may be constructed from silicon germanium (SiGe). The first region 402 may have a first dopant concentration, the second region may have a second dopant concentration, and the base region 406 may have a base dopant concentration. In embodiments, the first dopant concentration and the second dopant concentration may be greater than the base dopant concentration. In embodiments, the BJTs may be constructed to be symmetrical where the first dopant concentration and second dopant concentration are approximately the same. In embodiments, the first dopant concentration and second dopant concentration may be selected to be between the range of 5e19-1e21 atoms/cm$^3$ of arsenic (As) or phosphorous (P). In embodiments, the base dopant concentration may be selected to be between the range of 5e17-1e19 atoms/cm$^3$ of boron (B).

The BJTs 208B, 208C may each be connected to a programmable resistive memory element 108. The memory element 108 may be the same or substantially similar as discussed herein. The programmable resistance element 108 combined with the BJTs 208B, 208C may form a memory cell (FIG. 1, 110) as described herein.

The word line contacts 302 may be the same or substantially similar as discussed herein. The word line contacts 302 may contact and laterally enclose the base region. The word line contacts 302 may be constructed from conductive doped silicon. In embodiments, the word line contacts 302 may be made from epitaxially grown silicon. In certain embodiments, the word line contacts 302 may be made from polysilicon. The word line contacts 302 may have a word line dopant concentration approximately equal to a base dopant concentration of the base region 406. This may avoid creating a junction between the word line contacts 302 and the base region 406. The plurality of word line contacts 302 may have a lateral thickness in the X-direction of more than one half the word line distance 210 and less than one half the bit line distance (FIG. 3, 212) forming a contiguous word line along the X-direction.

The word line pickup 208D may be a BJT having an electrical contact 418 inserted to contact the base region 406. The electrical contact 418 may be constructed from doped silicon having the approximately same dopant concentration as the base region to avoid creating a junction between the electrical contact 418 and the base region 406. The electrical contact 418 may be connected to a word line decoder/driver (FIG. 1, 112) as described herein.

The first region pickup 204C may be the same or substantially similar as described herein. The first region pickup 204C may be inserted to contact the substrate 201. Through the substrate 201, the first region pickup 204C may be electrically connected to the first regions 402 of each BJT 208B, 208C. The first region pickup 204C may be connected to a common ground reference (FIG. 1, 116).

Figure 4B:
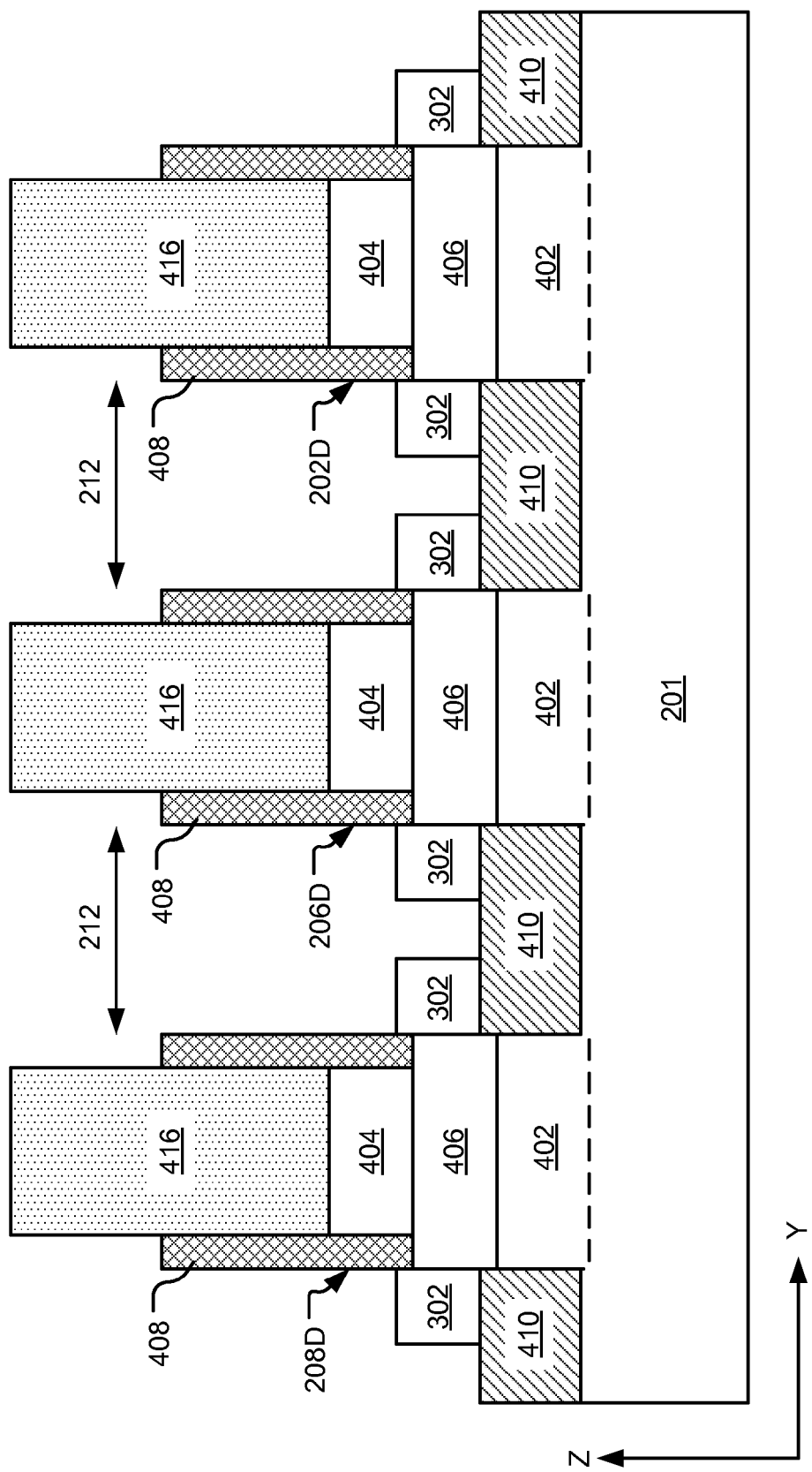

Referring now to FIG. 4B, a cross section in the Z-Y plane of a portion of the structure of FIG. 3 may be seen according to embodiments of the present disclosure. The cross section view may include BJTs 208C, 206C, 202C on substrate 201. The BJTs 208C, 206C, 202C and substrate 201 may be the same or substantially similar as described herein. Word line contacts 302 may be the same or substantially similar as discussed herein. As viewed in the Z-Y plane, the plurality of word line contacts 302 may have a lateral thickness in the Y-direction of more than one half the word line distance (FIG. 3, 210) and less than one half the bit line distance 212. Thus, the word line contacts 302 for each BJT are not in contact between rows and do not electrically connect. In embodiments, additional fill material may be formed between word line contacts 302 in the Y-direction to decrease the likelihood of electrical connection between the word line contacts 302 between rows.

Figure 5:
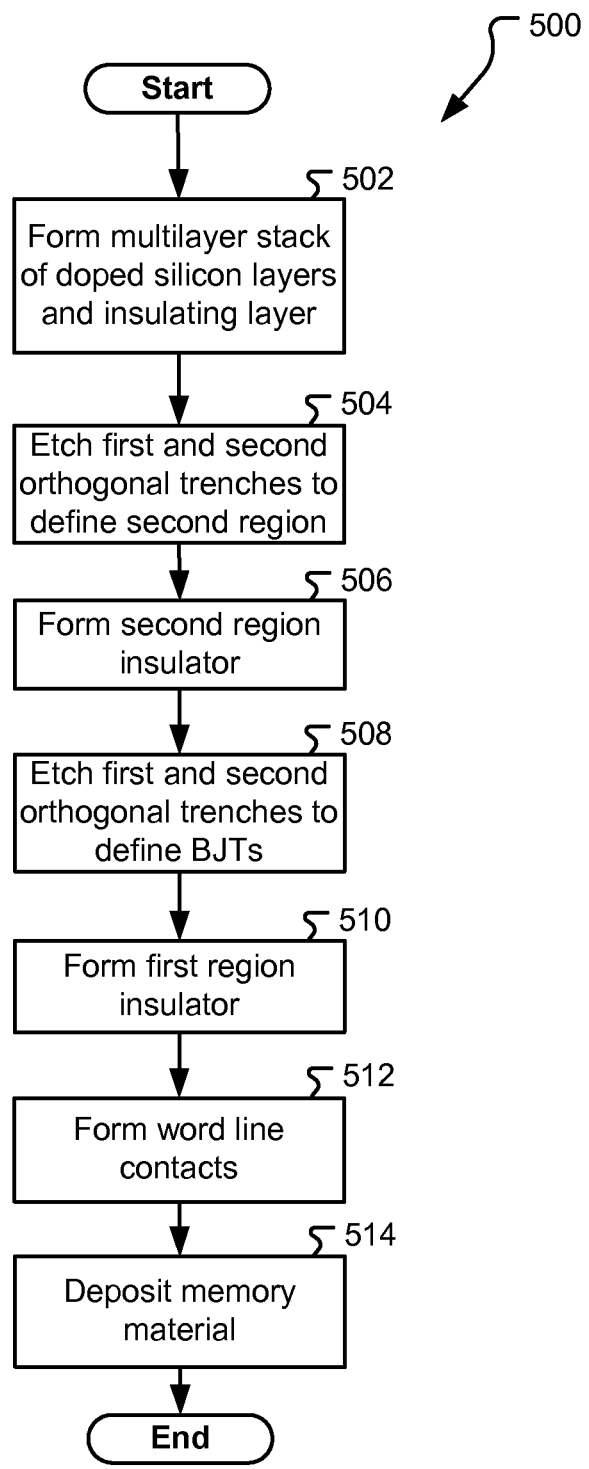
FIG. 5 shows a flowchart for a manufacturing process that may be used to create a bipolar junction transistor array configured for accessing an array of resistive memory elements according to embodiments of the present disclosure.

Referring now to FIG. 5, a flowchart may be seen for a manufacturing process 500 which may be used to form the structure of embodiments of the present disclosure. In operation 502, a multilayer stack may be formed including a first, second and third layer of doped silicon and an insulator layer. The second layer of doped silicon may be formed on the first layer of doped silicon. The third layer of doped silicon may be formed on the second layer. The insulator layer may be formed on the third layer of doped silicon.

In operation 504, first and second trenches may be etched in the multilayer stack to define a plurality of second regions. A double patterning process or manifold patterning process may be used to define lines and etch narrow trenches through the multilayer stack to define the second regions. The plurality of BJTs may be the same or substantially similar as described herein. The first and second trenches may extend through the insulator layer and the third doped silicon layer.

The second region may be a portion the third doped silicon layer between the trenches and which remains on the second doped silicon layer. The second region may be the same or substantially similar as described herein. The second region may be made from the third doped silicon layer and adapted to act as one of a collector or an emitter of the BJT as described herein.

The insulator layer may be constructed from sacrificial material (e.g. silicon nitride). In embodiments, the insulator layer may include a layer of silicon nitride with a first hard mask material deposited on the silicon nitride. The hard mask material may be patterned to define the first trenches and second trenches. After etching, the insulator layer may remain on the second region, defined by the first and second trenches.

In operation 506, a second region insulator may be formed on a "base ledge" of the BJTs. The base ledge may be created by the area of the second doped silicon layer underneath the second regions after the etching in operation 504. The second region insulator may be formed laterally enclosing each second region.

After the second region insulators are formed the first and second trenches may continue to be etched through in operation 508. The first and second trenches may be etched to be to define a plurality of BJTs. A double patterning process or manifold patterning process may be used to define lines and etch narrow trenches through the multilayer stack to define the BJTs. The plurality of BJTs may be the same or substantially similar as described herein. In operation 508, the first and second trenches may be etched through the second doped silicon layer partially through the first doped silicon layer. In operation 508, the first and second trenches may be etched more narrowly than in operation 504 so that the second region insulator is included in the BJTs. By narrowing the first and second trenches, the second region may have a width less than the width of the base region. The difference in widths may form a ledge, i.e., a base ledge, which laterally surrounds the second region and allows for placement of the second region insulator.

The substrate may be defined by a portion of the first doped silicon layer which remains below the first and second trenches. The substrate may be the same or substantially similar as described herein.

A first region of the BJT may be a portion of the first doped silicon layer between trenches and which remains above the substrate. The first region may be the same or substantially similar as described herein. The first region may be made from the first doped silicon layer and adapted to act as one of a collector or an emitter of the BJT, as described herein.

The base region may be a portion of the second doped silicon layer between trenches and which remains on the first region. The base region may be the same or substantially similar as described herein. The base region may be made from doped silicon of the second doped silicon layer and adapted to act as a base of the BJT, as described herein.

In operation 510 a first region insulator may be formed. The first region insulator may be the same or substantially similar as described herein. The first region insulator may be insulating material deposited on the substrate to fill the first and second trenches. The insulating material may be etched down so that the insulating material at least laterally encloses the first region of each BJT. The first region insulator may also partially enclose the base region so that the first region is insulated from the word line contacts (FIG. 4A, 302) placed on the first region insulator.

In operation 512, word line contacts may be formed. The word line contacts may be the same or substantially similar as described herein. The word line contacts may be constructed from conductive doped silicon. In embodiments, the word line contacts may be made from epitaxial silicon. In certain embodiments, the word line contacts may be made from polysilicon. Where the word line contacts are made from epitaxial silicon, the word lines contacts may be formed by growing an epitaxial layer of doped silicon laterally and vertically from the base region. A silicide or other contact material may then be formed on the epitaxial layer to improve conductivity with the base region.

Where the word line contacts are made from polysilicon, forming the word line contacts may include depositing a polysilicon layer directly on the first region insulator. In embodiments, the polysilicon may be deposited is in the shape of a thick spacer. After the being deposited, a spacer etch may be performed to disconnect the polysilicon in the bit line direction (leaving the connection in the word line direction). A silicide or other contact material may then be formed on the polysilicon to improve conductivity with the base region. In embodiments, filler material, such as silicon oxide, or other suitable filler material may be deposited on the polysilicon and planarized.

In operation 514 the plurality of BJTs may be connected to memory elements. In embodiments, the memory elements may include memory material, such as a phase change material made of a doped chalcogenide or other suitable material as described herein. In embodiments, the insulator layer may be removed to form vias over the second region of each of the plurality of BJTs. Memory elements may be connected to the BJTs using the vias, such as by forming electrode structures within the vias, or forming pores within the vias that can be later filled with memory material. Memory material may then be deposited over the BJTs, contacting the electrode structures or filling the pores.

Figure 6A:
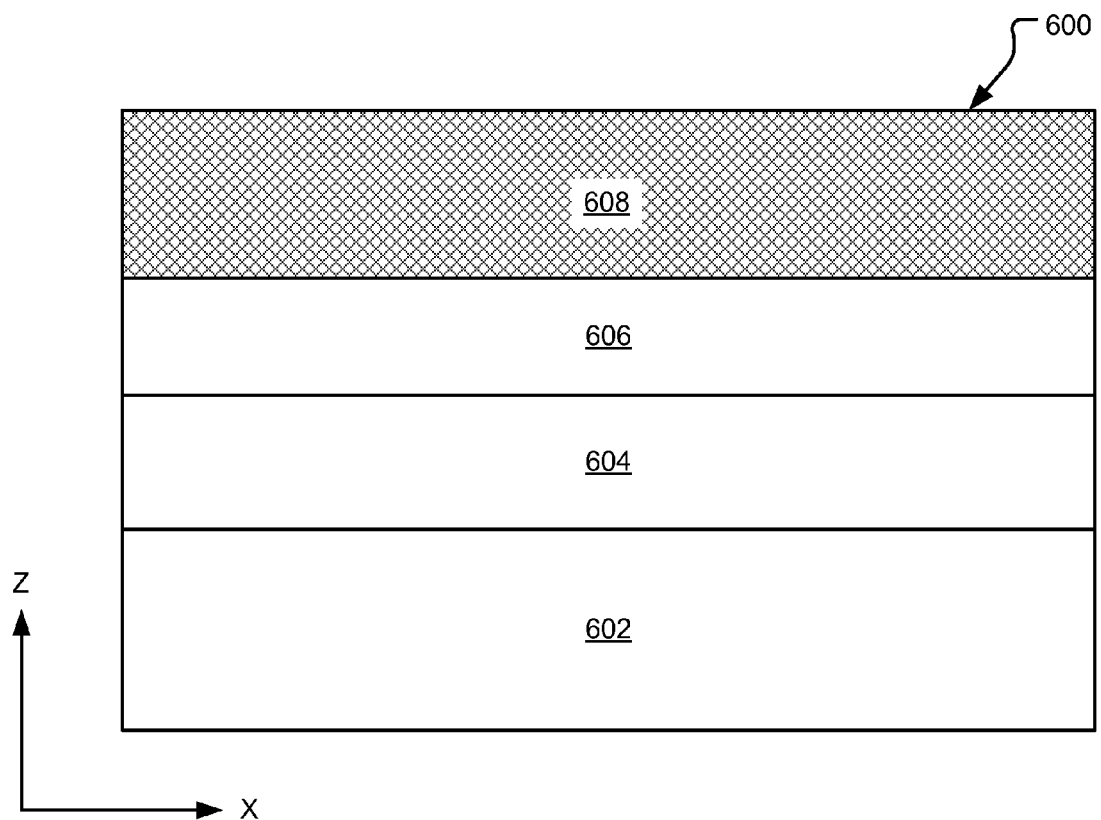
FIGS. 6A-6G manufacture of a bipolar junction transistor array configured for accessing an array of resistive memory elements according to embodiments of the present disclosure.

Referring now to FIG. 6A, a cross section of an illustrated stage in a manufacturing process for a memory array may be seen according to embodiments of the present disclosure. The cross section may include a multilayer stack 600 of a first doped silicon layer 602, a second doped silicon layer 604, a third doped silicon layer 606, and an insulator layer 608. The first doped silicon layer 602 may be provided as a base. The second doped silicon layer 604 may be formed directly on the first doped silicon layer 602. The third doped silicon layer 606 may be formed directly on the second doped silicon layer 604. The second and third doped silicon layers 604, 606 may be formed epitaxially, or by other suitable method.

The first doped silicon layer 602 may be made of material adapted to act as a BJT terminal, such as an emitter or a collector. The second doped silicon layer 604 may be made of material adapted to act as a base in the BJT. The third doped silicon layer 606 may be made of material adapted to act as a BJT terminal, such as an emitter or a collector. The insulator layer 608 may be constructed from sacrificial material (e.g. silicon nitride). In embodiments, the insulator layer 608 may include a layer of silicon nitride with a first hard mask material deposited on the silicon nitride. The hard mask material may be patterned to define first trenches and second trenches orthogonal to the first trenches. An etching process may be used to form trenches extending through the multilayer stack 600 and define a plurality of BJTs in the multilayer stack 600 as seen herein. The first and second trenches may extend in the Y-direction perpendicular to the page and in the X-direction parallel with the page to define the plurality of BJTs.

Figure 6B:
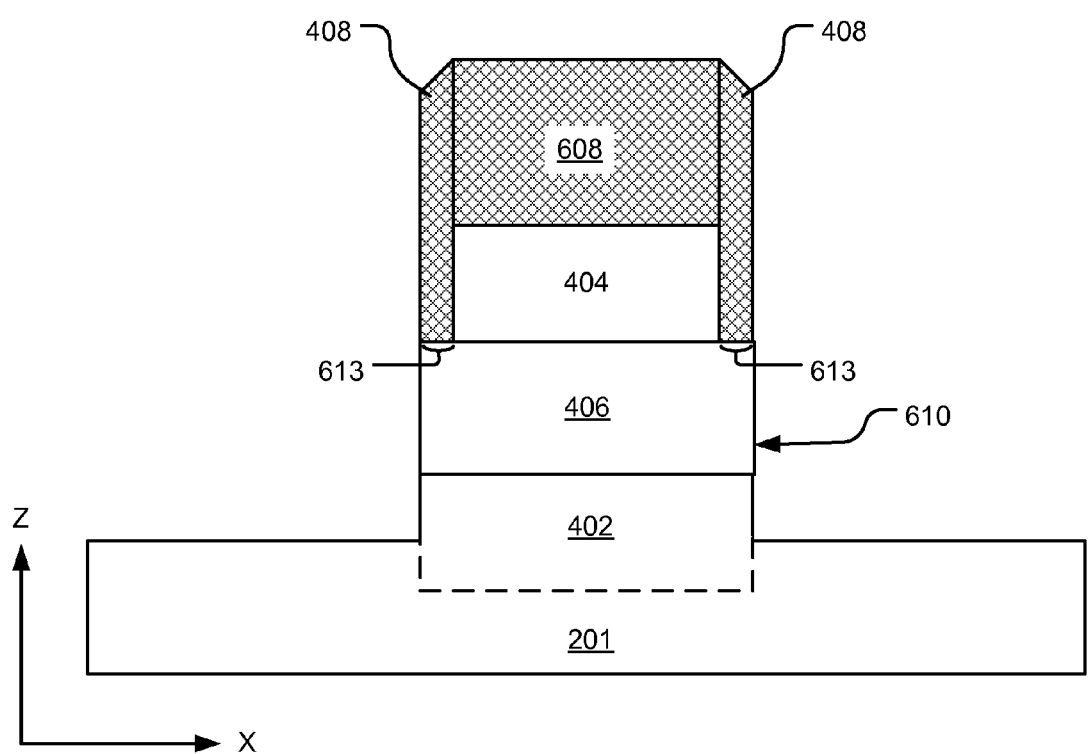

Referring now to FIG. 6B, a cross section of an illustrated stage in a manufacturing process for a memory array may be seen according to embodiments of the present disclosure. The cross section may include a BJT 610 on a substrate 201. The BJT 610 may include a first region 402, a second region 404, a base region 406, an insulator layer 608, and a second region insulator 408.

The BJT 610 may be formed from the multilayer stack 600 as seen in FIG. 6A. The multilayer stack 600 may have one or more trenches etched through layers of the stack to define the BJT and the substrate 201, as described herein. In embodiments, the BJT 610 may be formed by etching first trenches and second trenches orthogonal to the first trenches, the first and second trenches extending through the insulator layer 608, the third doped silicon layer 606, and the second doped silicon layer 604, and partially through the first doped silicon layer 602. The substrate 201, the first region 402, second region 404, and base region 406 may be defined by the first and second trenches as described herein.

The second region insulator 408 may be insulating material laterally enclosing the second region 404. The second region insulator may be the same or substantially similar as described herein. The second region insulator 408 may be formed by etching the perimeter of the second region 404 down to the top of the base region 406. After etching, the second region may have a width less than the width of the base region that forms a ledge 613. The ledge 613 may laterally surround the second region 404 and allow for placement of the second region insulator 408 on the ledge 613 to laterally enclose the second region 404.

Figure 6C:
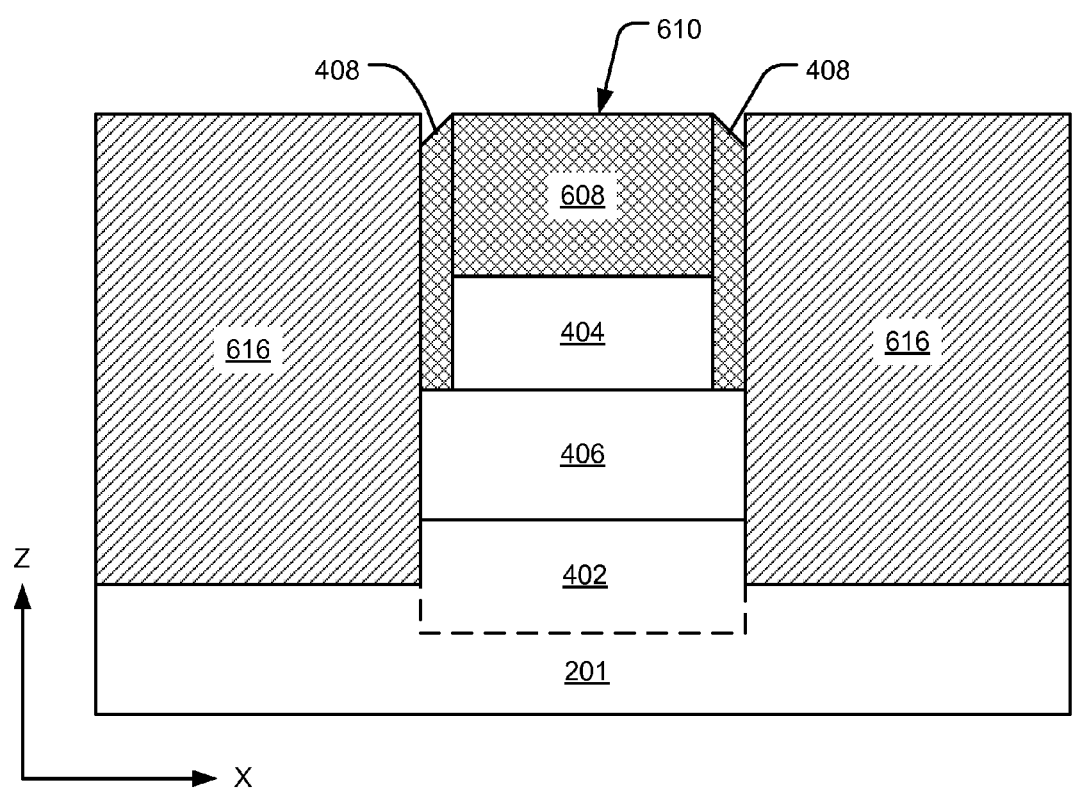

Referring now to FIG. 6C, a cross section of an illustrated stage in a manufacturing process for a memory array may be seen according to embodiments of the present disclosure. The cross section may include a BJT 610 on a substrate 201 with a second insulator layer 616. The BJT 610 and the substrate 201 may be the same or substantially similar as described herein. The second insulator layer 616 may be deposited on the substrate 201 and planarized to fill the first and second trenches in the multilayer stack 600. The second insulator layer 616 may be constructed from silicon oxide, or other suitable insulating materials.

Figure 6D:
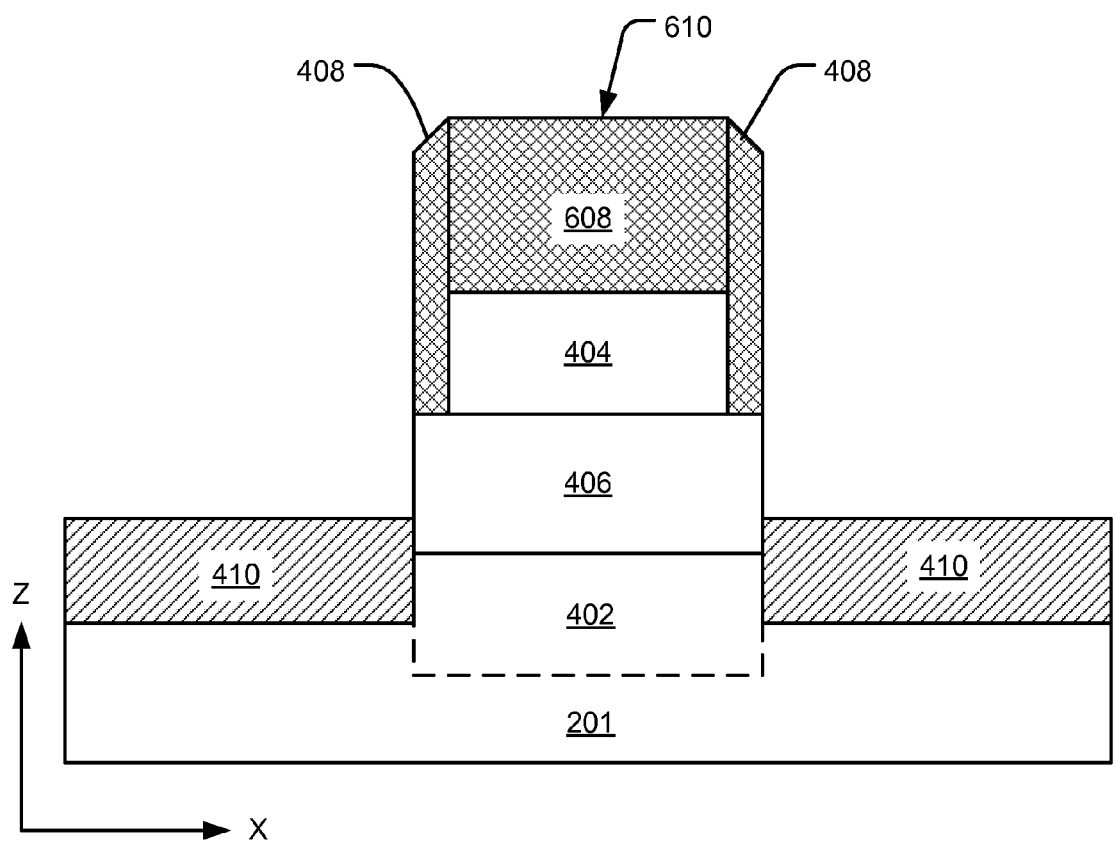

Referring now to FIG. 6D, a cross section of an illustrated stage in a manufacturing process for a memory array may be seen according to embodiments of the present disclosure. The cross section may include a BJT 610 on a substrate 201 and a first region insulator 410. The first region insulator 410 may be the same or substantially the same as the first region insulator 410 as described herein. The first region insulator 410 may be formed by etching the second insulator layer 616 down to enclose the first region and partially enclose the base region 406.

Figure 6E:
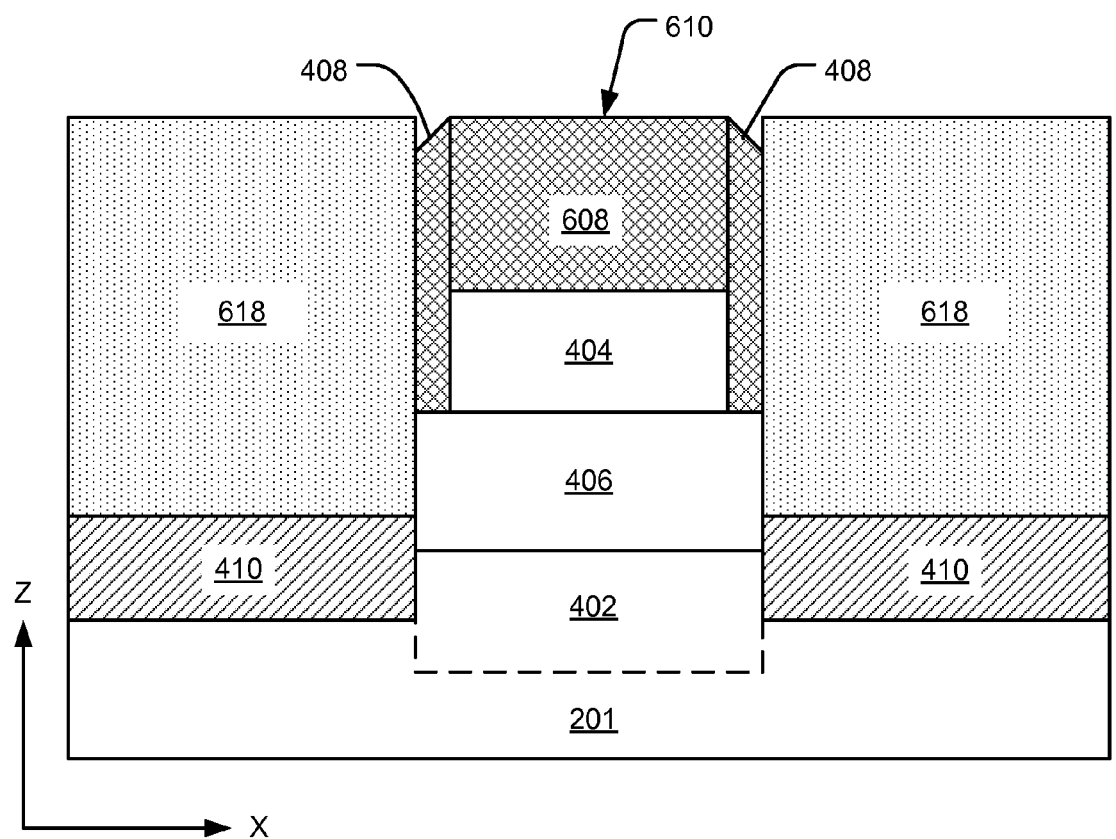

Referring now to FIG. 6E, a cross section of an illustrated stage in a manufacturing process for a memory array may be seen according to embodiments of the present disclosure. The cross section may include a BJT 610 on a substrate 201, a first region insulator 410, and word line material 618 formed on the first region insulator 410. The word line material 618 may be doped silicon, including polysilicon and epitaxial silicon. In embodiments, when the word line material 618 is epitaxial silicon, the word line material 618 may be epitaxially formed from the base region 406. The word line material 618 may be etched down in the Z-direction to at least laterally and vertically enclose the base region 406.

In embodiments, when the word line material 618 is polysilicon, the polysilicon may be deposited in the shape of a thick spacer. After the being deposited, a spacer etch may be performed to disconnect the polysilicon in the bit line direction (leaving the connection in the word line direction). A silicide or other contact material may then be formed on the polysilicon to improve conductivity with the base region. In embodiments, filler material, such as silicon oxide, or other suitable filler material may be deposited on the polysilicon and planarized.

Figure 6F:
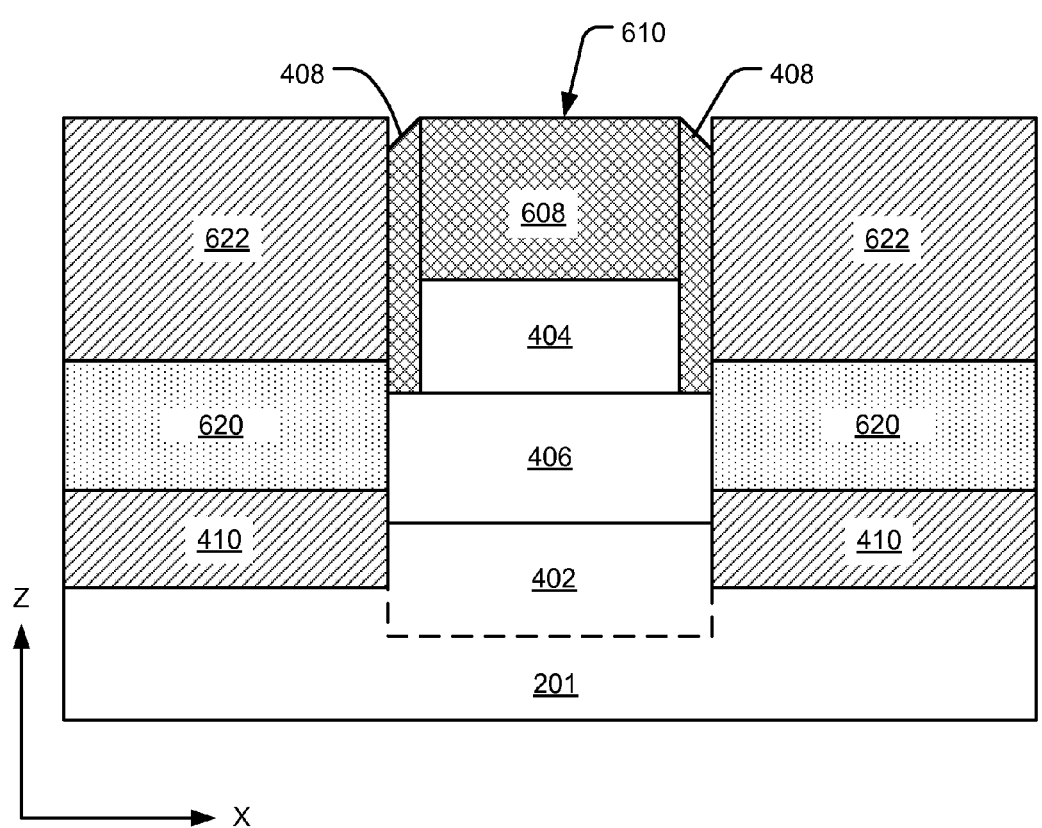

Referring now to FIG. 6F, a cross section of an illustrated stage in a manufacturing process for a memory array may be seen according to embodiments of the present disclosure. The cross section may include a BJT 610 on a substrate 201, a first region insulator 410, and word line contacts 620 formed on the first region insulator 410. In FIG. 6F, the word line contacts 620 may be constructed from polysilicon material as described herein. The word line contacts 620 may be the word line material 618 after being etched to at least laterally enclose the base region 406. A silicide or other contact material may be formed on the word line contacts 620 to improve conductivity with the base region 406. Filler material 622, such as silicon oxide, or other suitable filler material may also be deposited on the word line contacts 620.

Figure 6G:
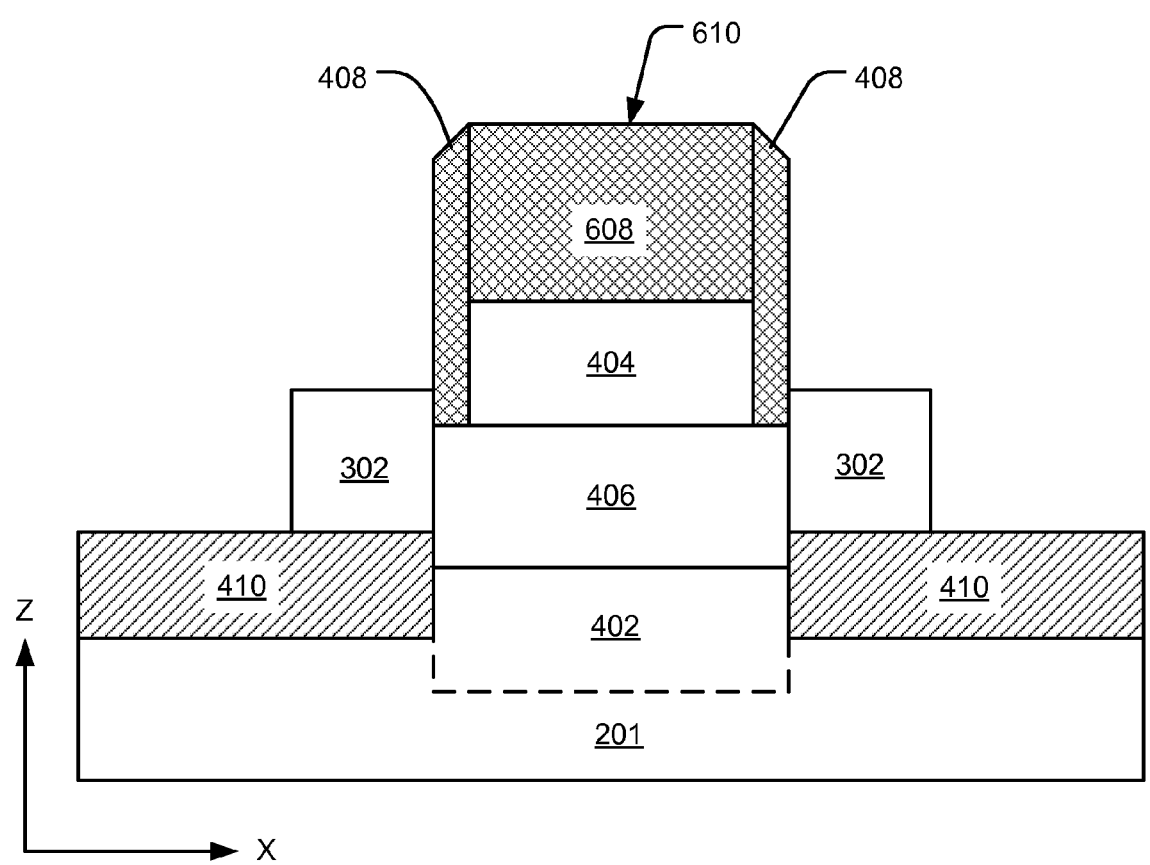

Referring now to FIG. 6G, a cross section of an illustrated stage in a manufacturing process for a memory array may be seen according to embodiments of the present disclosure. The cross section may include a BJT 610 on a substrate 201, a first region insulator 410, and word line contacts 302 formed on the first region insulator 410. The word line contacts 302 may be the same or substantially similar as described herein. In FIG. 6G, the word line contacts 302 may be constructed from epitaxial silicon material as described herein. The word line contacts 302 may be the word line material 618 after being etched to at least laterally enclose the base region 406, as described herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of manufacturing a bipolar junction transistor (BJT) array, the method comprising:
   forming a substrate of doped silicon;
   forming a plurality of vertical BJTs, each of the plurality of BJTs having a first region of doped silicon and a second region of doped silicon sandwiching a base region vertically, relative to the substrate, the first region in contact with the substrate, wherein the BJTs are formed in a first row and a second row, the first row and the second row each having BJTs separated from one another by a word line distance and the first row and second row separated by a bit line distance;
   forming a first region insulator on the substrate, the first region insulator laterally enclosing each first region and partially enclosing each base region of the plurality of BJTs;
   etching a sidewall of each second region down to the base region to form a ledge laterally surrounding each second region;
   forming a second region insulator on each ledge of the plurality of BJTs, the second region insulator laterally enclosing the second region; and
   forming a plurality of word line contacts directly on the first region insulator, the word line contacts laterally enclosing and electrically connected to each base region of the plurality of BJTs, the plurality of word line contacts electrically insulated from the second region by the second region insulator, wherein the plurality of word line contacts have a lateral thickness more than one half the word line distance and less than one half the bit line distance.

2. The method of claim 1, further comprising:
   connecting each of the second region to a resistive memory element.

3. The method of claim 2, wherein:
   the resistive memory element is selected from a group consisting of resistive random access memory, ferro-electric random access memory, spin-transfer torque memory, phase change random access memory, and magneto-resistive random access memory.

4. The method of claim 1, wherein the forming of the substrate, the second region insulator and the plurality of BJTs includes:
   providing a first doped silicon layer;
   forming a second doped silicon layer directly on the first doped silicon layer;
   forming a third doped silicon layer directly on the second doped silicon layer;
   forming an insulator layer directly on the third doped silicon layer; and
   etching first trenches and second trenches orthogonal to the first trenches, the first and second trenches etched through the insulator layer and the third doped silicon layer, wherein the second region is a portion of the third doped silicon layer on the second doped silicon layer defined by the first and second trenches, the second region adapted to act as one of a collector or an emitter;
   forming an insulator sidewall layer enclosing the second region; and
   etching the first and second trenches through the second doped silicon layer, and partially through the first doped silicon layer;
   wherein the substrate is defined by a portion of the first doped silicon layer below the first and second trenches;
   the first region is a portion of the first doped silicon layer above the substrate, defined by the first and second trenches, the first region adapted to act as one of a collector or an emitter;
   the base region is a portion of the second doped silicon layer on the first region, defined by the first and second trenches.

5. The method of claim 1, wherein forming a plurality of word line contacts includes:
   growing an epitaxial layer of doped silicon laterally and vertically from the base region.

6. The method of claim 1, wherein forming a plurality of word line contacts includes:
   depositing a polysilicon layer directly on the first region insulator;

planarizing a surface of the polysilicon layer; and etching the polysilicon layer so that the polysilicon layer at least laterally encloses the base region.

7. The method of claim 1, wherein:

the plurality of word line contacts in the first row form a first word line along the first row and the plurality of word line contacts in the second row form a second word line along the second row.

8. The method of claim 1, wherein:

each of the plurality of BJTs are of a feature size, and wherein the word line distance is approximately equal to the feature size and wherein the bit line distance is approximately equal to two times the feature size.

9. The method of claim 1, wherein:

the base region has a first base junction between the first region and the base region, and a second base junction between the second region and the base region, and wherein the first base junction and the second base junction have an area that is substantially the same.

10. The method of claim 1, wherein:

the first region is a collector and the second region is an emitter.

11. The method of claim 1, wherein:

the first region is an emitter and the second region is a collector.

12. The method of claim 1, wherein:

The first region has a first dopant concentration, the second region has a second dopant concentration, and wherein the first dopant concentration and the second dopant concentration are approximately the same.

13. An array of bipolar junction transistors (BJTs) comprising:

a substrate of doped silicon;

a plurality of BJTs, each of the plurality of BJTs having a first region of doped silicon and a second region of doped silicon sandwiching a base region vertically, relative to the substrate, the first region in contact with the substrate, the base region having a first width greater than a second width of the second region such that the base region defines a ledge laterally surrounding each second region, wherein the BJTs are positioned in a first row and a second row, the first row and second row each having BJTs separated from one another by a word line distance and the first row and second row separated by a bit line distance;

a first region insulator on the substrate, the first region insulator laterally enclosing each first region and partially enclosing each base region of the plurality of BJTs;

a second region insulator on each ledge of the plurality of BJTs, the second region insulator laterally enclosing the second region;

a plurality of word line contacts directly on the first region insulator, the word line contacts laterally enclosing and electrically connected to each base region of the plurality of BJTs, the plurality of word line contacts electrically insulated from the second region by the second region insulator, wherein the plurality of word line contacts have a lateral thickness more than one half the word line distance and less than one half the bit line distance.

14. The array of claim 13, wherein:

each of the second regions are connected to a resistive memory element.

15. The array of claim 14, wherein:

the resistive memory element is selected from a group consisting of resistive random access memory, ferroelectric random access memory, spin-transfer torque memory, phase change random access memory, and magneto-resistive random access memory.

16. The array of claim 13, wherein:

the plurality of word line contacts in the first row form a first word line along the first row and the plurality of word line contacts in the second row form a second word line along the second row.

17. The array of claim 13, wherein:

each of the plurality of BJTs are of a feature size, and wherein the word line distance is approximately equal to the feature size and wherein the bit line distance is approximately equal to two times the feature size.

18. The array of claim 13, wherein:

the base region has a first base junction between the first region and the base region, and a second base junction between the second region and the base region, and wherein the first base junction and the second base junction have an area that is substantially the same.

19. The array of claim 13, wherein:

the first region is a collector and the second region is an emitter.

20. The array of claim 13, wherein:

the first region has a first dopant concentration, the second region has a second dopant concentration, and wherein the first dopant concentration and the second dopant concentration are substantially the same.

* * * * *